US008877646B2

(12) United States Patent
Marty et al.

(10) Patent No.: US 8,877,646 B2
(45) Date of Patent: Nov. 4, 2014

(54) FILM STACKS AND METHODS THEREOF

(75) Inventors: Valerie J Marty, Corvallis, OR (US); Galen P. Cook, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/640,694

(22) PCT Filed: Apr. 19, 2010

(86) PCT No.: PCT/US2010/031565
§ 371 (c)(1),
(2), (4) Date: Oct. 11, 2012

(87) PCT Pub. No.: WO2011/133133
PCT Pub. Date: Oct. 27, 2011

(65) Prior Publication Data

US 2013/0034703 A1 Feb. 7, 2013

(51) Int. Cl.
*H01L 21/302* (2006.01)
*B41J 2/16* (2006.01)

(52) U.S. Cl.
CPC .............. *B41J 2/1601* (2013.01); *B41J 2/1628* (2013.01)
USPC ............. 438/696; 438/724; 438/740; 216/27; 216/67; 216/72

(58) Field of Classification Search
None
See application file for complete search history.

(56) References Cited

U.S. PATENT DOCUMENTS

| | | | | |
|---|---|---|---|---|
| 2005/0174390 | A1 | 8/2005 | Sun et al. | |
| 2007/0042113 | A1 | 2/2007 | Ji et al. | |
| 2009/0027450 | A1 | 1/2009 | Park et al. | |
| 2009/0294810 | A1 * | 12/2009 | Stadel et al. | 257/288 |

OTHER PUBLICATIONS

International Search Report and Written Opinion, Application No. PCT/US2010/031565, Dated Dec. 29, 2010, pp. 9.

* cited by examiner

*Primary Examiner* — Anita Alanko

(57) ABSTRACT

A method of manufacturing a plurality of spacers in a film stack includes forming at least one electrically-conductive element having sidewalls on a substrate, depositing a plurality of passivation layers proximate to the substrate, and performing etching on one of the plurality of passivation layers to form a plurality of spacers substantially across from the sidewalls of the at least one electrically-conductive element.

15 Claims, 5 Drawing Sheets

FILM STACKS AND METHODS THEREOF

BACKGROUND OF THE DISCLOSURE

Film stacks including several layers are used with a thermal fluid ejector apparatus. Such film stacks, for example, are used in thermal inkjet print heads in order to eject ink droplets through the collapse of bubbles formed by heating the ink.

DESCRIPTION OF THE DRAWINGS

Exemplary non-limiting embodiments of the general inventive concept are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

The present general inventive concept is directed toward a film stack usable with a thermal fluid ejector apparatus and a method of manufacturing a plurality of spacers in the film stack. The thermal fluid ejector apparatus may be, for example, a thermal inkjet print head to eject ink droplets through the collapse of bubbles formed by heating the ink. The film stack, for example, may include a substrate, resistors and conductive interconnect lines each having sidewalls, several passivation layers, and a plurality of spacers formed from one of the passivation layers. The spacers are disposed substantially across from the respective sidewalls of the resistors and conductive interconnect lines.

In accordance with the present general inventive concept, the plurality of spacers are formed from a passivation layer through etching and disposed substantially across from the respective sidewalls of the resistors and conductive interconnect lines. Such an arrangement of spacers, for example, increase dielectric thickness to the sidewalls of the respective electrically-conductive element and improve step coverage. The spacers of the present general inventive concept enable thin passivation layers to cover the respective topography as compared to conventional film stacks which include a thicker passivation layer susceptible to thin spots due to poor coverage over rough topography. The more conformal passivation layers also prevent seams from forming a direct chemical path to the resistors and conductive interconnect lines resulting in chemical protection and electrical isolation.

Figure 1A:
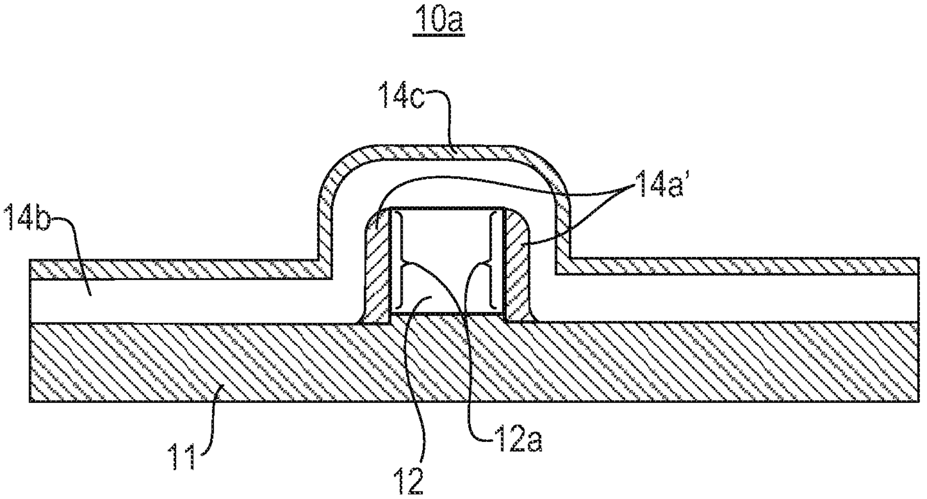
FIG. 1A is a side view illustrating a film stack usable with a thermal fluid ejector apparatus according to an example embodiment of the present general inventive concept.
Figure 1B:
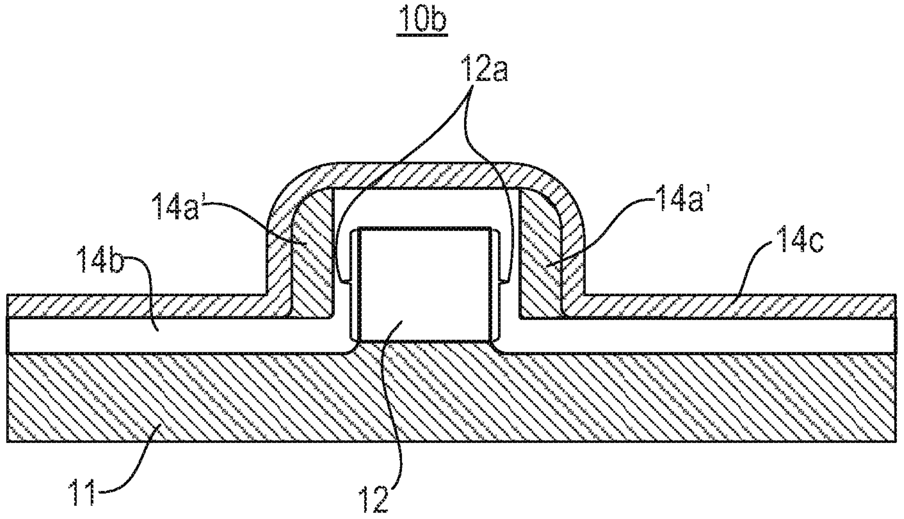
FIG. 1B is a side view illustrating a film stack usable with a thermal fluid ejector apparatus according to another example embodiment of the present general inventive concept.

FIG. 1A is a side view illustrating a film stack usable with a thermal fluid ejector apparatus according to an example embodiment of the present general inventive concept. FIG. 1B is a side view illustrating a film stack usable with a thermal fluid ejector apparatus according to another example embodiment of the present general inventive concept. Referring to FIGS. 1A and 1B, in the present examples, a film stack 10*a* and 10*b* includes a substrate 11, at least one electrically-conductive element 12 having sidewalls 12*a* disposed on the substrate 11, and a plurality of passivation layers including an electrical insulator passivation layer 14*b* configured to provide electrical insulation and a chemical insulator passivation layer 14*c* configured to provide chemical insulation. In the present example, the electrical insulator passivation layer 14*b* includes a dielectric film of Silicon Nitride (SiN) which has good deposition coverage over topography and the chemical insulator passivation layer 14*c* includes a dielectric film of Silicon Carbide (SiC) which is resistant to chemical attack.

Referring to FIGS. 1A and 1B, in an example, the at least one electrically-conductive element 12 includes at least one of a resistor and an electrically-conductive interconnect line having sidewalls 12*a* and the plurality of spacers 14*a*' formed from one of the plurality of passivation layers and disposed substantially across from the sidewalls 12*a* of the at least one electrically-conductive element 12. For example, a passivation layer 14*a* (FIGS. 3C and 4D) is etched to form spacers 14*a*'. In an example, a thickness of the spacers 14*a*' is set by a thickness of the passivation layer 14*a*. Such spacers 14*a*', for example, increase dielectric thickness to the sidewalls 12*a* of the respective electrically-conductive element 12 and improve step coverage. In the present example, the plurality of spacers 14*a* includes rounded top portions.

Such spacers 14*a*' enable thin passivation layers, for example, by decoupling a thickness of the electrical insulator passivation layer 14*b* to the sidewalls 12*a* of the respective electrically-conductive element 12 from the electrical insulator passivation layer 14*b* above the respective electrically-conductive element 12. The spacers 14*a*' also prevent seams from forming a direct chemical path to the at least one electrically-conductive element 12 resulting in robust electrical isolation and protection from chemical attack. Thus, in the present example, the spacers 14*a*' allow for the electrical insulator passivation layer 14*b* to be thin and provide improved thermal performance, while offering improved chemical and mechanical robustness of the electrically-conductive element 12.

In an example, as illustrated in FIG. 1A, the spacers 14*a*' of the film stack 10*a* are disposed in contact with the substrate 11, the at least one of a resistor and an electrically-conductive interconnect line, and the electrical insulator passivation layer 14*b*. Also, the electrical insulator passivation layer 14*b* of the film stack 10*a* is in contact with the substrate 11, the plurality of spacers 14*a*, the at least one electrically-conductive element 12 and the chemical insulator passivation layer 14*c*. In the present example, the spacers 14*a*' are formed from a passivation layer 14*a*, for example, including SiN. In an example, the chemical insulator passivation layer 14*c* include SiC, and the spacers 14*a*' and the electrical insulator passivation layer 14*b* include SiN.

Figure 1C:
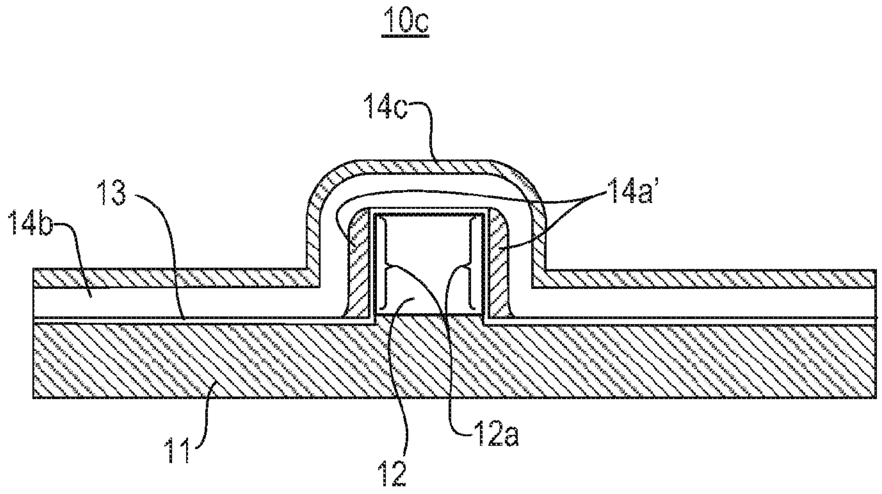
FIG. 1C is a side view of the film stack of FIG. 1A including an etch stop layer according to an example embodiment of the present general inventive concept.

FIG. 1C is a side view of the film stack of FIG. 1A including an etch stop layer according to an example embodiment of the present general inventive concept. The film stack 10*c* illustrated in FIG. 1C includes the film stack 10*a* illustrated in FIG. 1A with the addition of an etch stop layer 13 configured to provide chemical insulation and function as a stop layer in formation of spacers 14*a*' through etching. Referring to FIG. 1C, in the present example, the etch stop layer 13 of the film stack 10*c* is disposed in contact with the substrate 11, the at least one of a resistor and an electrically-conductive interconnect line, the plurality of spacers 14*a*' and the electrical insulator passivation layer 14*b*. Also, in the present example, the electrical insulator passivation layer 14*b* of the film stack 10*a* is in contact with the etch stop layer 13, the plurality of spacers 14*a*', and the chemical insulator passivation layer 14*c*. In the present example, the spacers 14*a*' are formed from a passivation layer 14*a*, for example, including SiN. In an example, the etch stop layer 13 and the chemical insulator passivation layer 14*c* include SiC, and the spacers 14*a*' and the electrical insulator passivation layer 14*b* include SiN.

In an example as illustrated in FIG. 18, the electrical insulation passivation layer 14*b* of the film stack 10*b* is disposed in contact with the substrate 11, at least one electrically-conductive element 11 the electrical insulator passivation layer 14*b*, the plurality of spacers 14*a*', and the chemical insulator passivation layer 14*c*.

Figure 1D:
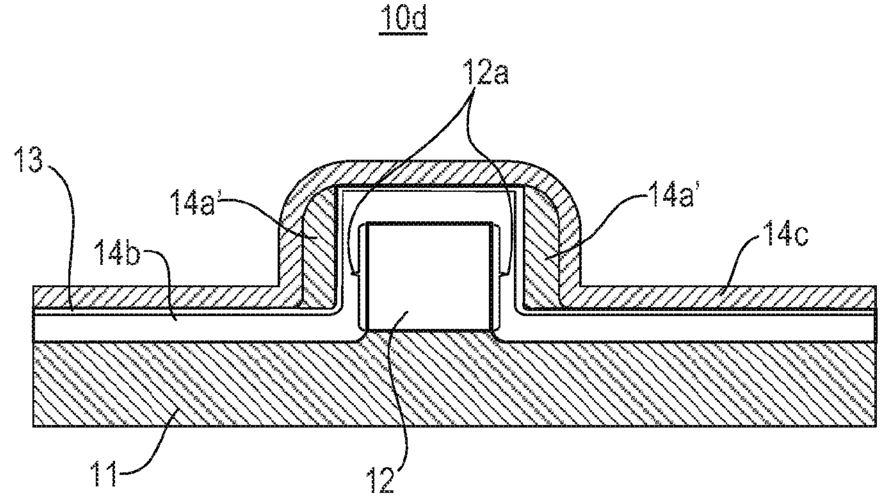
FIG. 1D is a side view of the film stack of FIG. 1B including an etch stop layer according to an example embodiment of the present general inventive concept.

FIG. 1D is a side view of the film stack usable of FIG. 1B including an etch stop layer according to an example embodiment of the present general inventive concept. The film stack 10*d* illustrated in FIG. 10 includes the film stack 10*b* illustrated in FIG. 1B with the addition of an etch stop layer 13 configured to provide chemical insulation and function as a stop layer in formation of spacers 14*a*' through etching. Referring to FIG. 1D, in the present example, the etch stop layer 13 of the film stack 10*d* is disposed in contact with plurality of spacers 14*a*', the electrical insulator passivation layer 14*b* and the chemical insulator passivation layer 14*c*. Also, in the present example, the electrical insulator passivation layer 14*b* is in contact with the substrate 11, the electrically-conductive element 12 and the etch stop layer 13, and the chemical insulator passivation layer 14*c* is in contact with the plurality of spacers 14*a*' and the etch stop layer 13. In the present example, the spacers 14*a*' are formed from a passivation layer 14*a*, for example, including SiN. In an example, the etch stop layer 13 and the chemical insulator passivation layer 14*c* include SiC, and the spacers 14*a*' and the electrical insulator passivation layer 14*b* include SiN.

Figure 2:
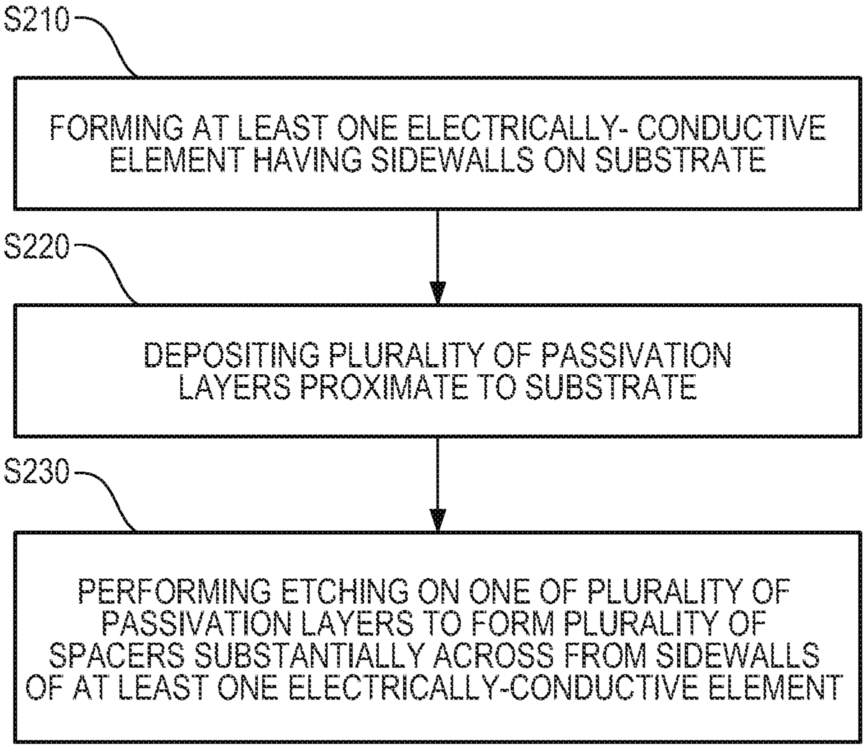
FIG. 2 is a flowchart illustrating a method of manufacturing a plurality of spacers in a film stack according to an example embodiment of the present general inventive concept.

FIG. 2 is a flowchart illustrating a method of manufacturing a plurality of spacers in a film stack according to an example embodiment of the present general inventive concept. Referring to FIG. 2, in block S210, at least one electrically-conductive element having sidewalls on a substrate is formed. In an example, the at least one electrically-conductive element may include at least one of a resistor and an electrically-conductive interconnect line. In block S220, a plurality of passivation layers is deposited proximate to the substrate. In block S230, etching on one of the plurality of passivation layers is performed to form a plurality of spacers substantially across from the sidewalls of the at least one electrically-conductive element. In an example, the method of manufacturing a plurality of spacers may further include an etch stop layer being deposited proximate to the substrate.

Figure 3A:
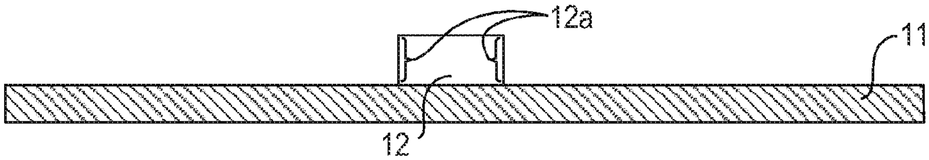
FIGS. 3A-3F are sequential views illustrating the method of manufacturing a plurality of spacers as illustrated in FIG. 2 according to an example embodiment of the present general inventive concept.

FIGS. 3A-3F are sequential views illustrating the method of manufacturing a plurality of spacers as illustrated in FIG. 2 according to an example embodiment of the present general inventive concept. Referring to FIG. 3A, at least one electrically-conductive element 12 having sidewalls 12*a* on a substrate 11 is formed. In an example, the at least one electrically-conductive element 12 may include at least one of a resistor, for example having a thickness of approximately 4000 angstroms and an electrically-conductive interconnect line, for example, having a thickness of 6000 angstroms formed by photo and etch processes.

Figure 3B:
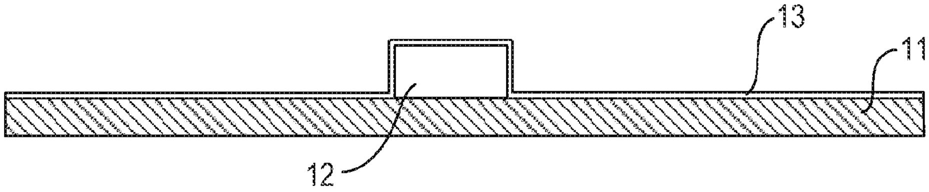

As illustrated in FIG. 3B, an etch stop layer 13 may be deposited proximate to the substrate 11. In this example, depositing an etch stop layer 13 proximate to the substrate 11 may include depositing the etch stop layer 13 in contact with the substrate 11 and the at least one electrically-conductive element 12 as illustrated in FIG. 3B. The etch stop layer 13 is configured to function as a stop layer, for example, for etching such as anisotropically dry etching to form the spacers 14*a*' and provide chemical isolation. In an example, the etch stop layer 13 may include SiC and have a thickness of approximately 100 angstroms. One of the plurality of passivation layers, that is, the spacer passivation layer 14*a*, in contact with the etch stop layer 13 may be in the form of a plurality of spacers 14*a*' as illustrated in FIG. 3E.

Figure 3C:
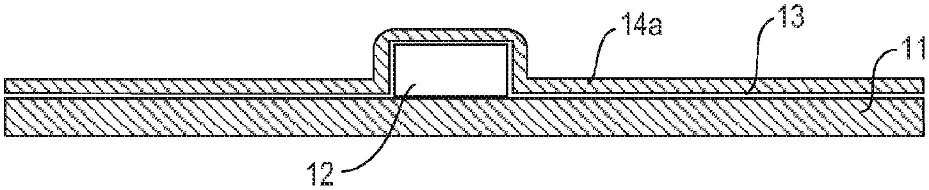
Figure 3D:
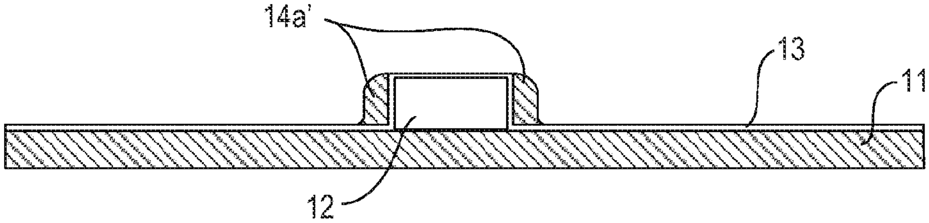
Figure 3E:
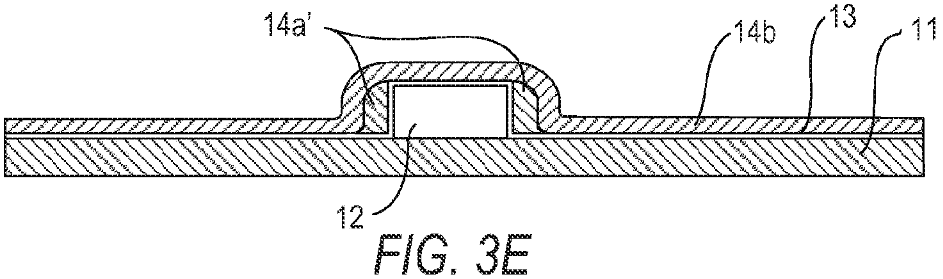
Figure 3F:
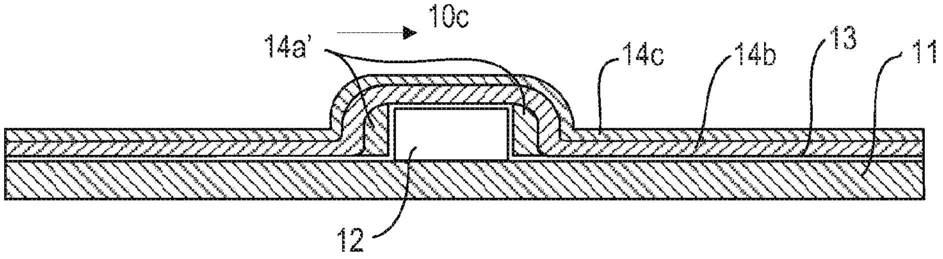

Referring to FIGS. 3C-3F, depositing a plurality of passivation layers proximate to the substrate 11 may include depositing a spacer passivation layer 14*a*, for example, on the etch stop layer 13 to be formed into the plurality of spacers 14*a*' (FIG. 3C), depositing an electrical isolator passivation layer 14*b* on the plurality of spacers 14*a*' (FIG. 3E), and depositing a chemical isolator passivation layer 14*c* on the electrical isolator passivation layer 14*b* (FIG. 3F). Thus, for example, the film stack 100 illustrated in FIG. 10 is formed. In an example, the spacer passivation layer 14*a* may have a thickness of 1675 angstroms prior to it being form into the spacers 14*a*'. In an example, the electrical isolator passivation layer 14*b* may have a thickness of approximately 1675 angstroms. Referring to FIGS. 3C and 3D, in an example, performing etching on one of the plurality of passivation layers 14*a* to form a plurality of spacers 14*a*' substantially across from the sidewalls 12*a* may include anisotropically dry etching the spacer passivation layer 14*a* to form the plurality of spacers 14*a*', for example, having rounded top portions substantially across from the sidewalls 12*a*. In the present example, the spacer passivation layer 14*a* and the electrical isolator passivation layer 14*b* may include a same material, for example, SiN. In an example, the chemical isolator passivation layer 14*c* may include SiC and have a thickness, for example, 725 angstroms, to increase the passivation layers to a thickness to maintain performance of the at least one electrically-conductive element 12.

Figure 4A:
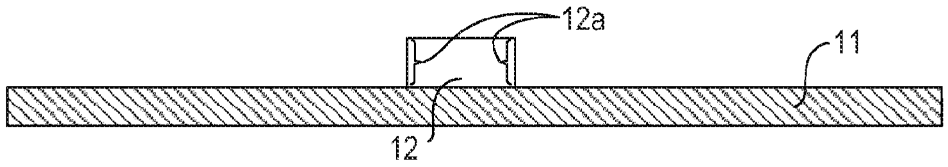
FIGS. 4A-4F are sequential views illustrating the method of manufacturing a plurality of spacers as illustrated in FIG. 2 according to an example embodiment of the present general inventive concept.
Figure 4B:
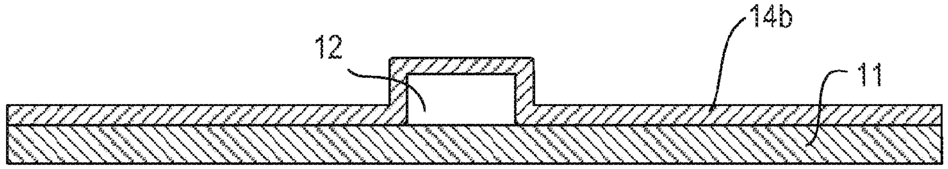
Figure 4C:
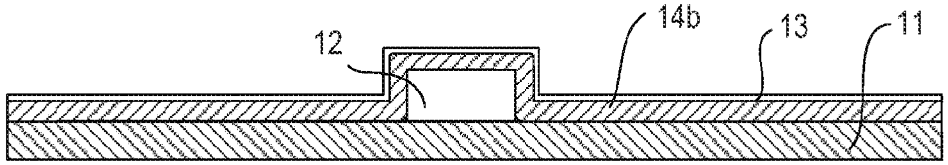

FIGS. 4A-4F are sequential views illustrating the method of manufacturing a plurality of spacers 14*a*' as illustrated in FIG. 2 according to an example embodiment of the present general inventive concept. Referring to FIG. 4A, at least one electrically-conductive element 12 having sidewalls 12*a* on a substrate 11 is formed. In an example, the at least one electrically-conductive element 12 may include at least one of a resistor, for example having a thickness of approximately 4000 angstroms and an electrically-conductive interconnect line, for example, having a thickness of 6000 angstroms formed by photo and etch processes. As illustrated in FIG. 4B, in an example, depositing the plurality of passivation layers proximate to the substrate 11 may include depositing an electrical isolator passivation layer 14*b* on the substrate 11 and the at least one of the resistor and the electrically-conductive interconnect line. In an example, the electrical isolator passivation layer 14*b* may include SiN and have a thickness of approximately 1675 A. Referring to FIG. 4O, depositing an etch stop layer 13 proximate to the substrate 11 may include depositing the etch stop layer 13 between and in contact with the spacer passivation layer 14*a* and the electrical isolator passivation layer 14*b*. The etch stop layer 13 is configured to function as a stop layer, for example, for etching such as anisotropically dry etching to form the spacers 14*a*' and provide chemical isolation. In an example, the etch stop layer 13 may include SiC and have a thickness of approximately 100 angstroms.

Figure 4D:
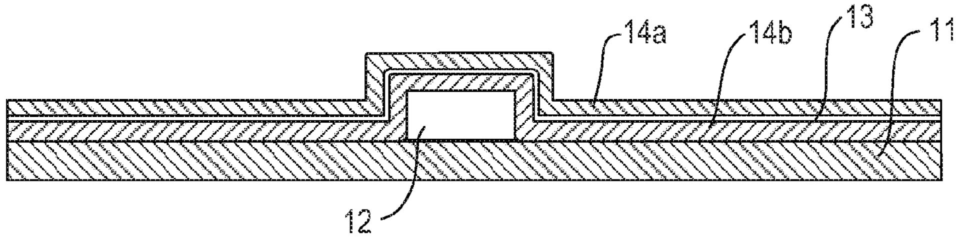
Figure 4E:
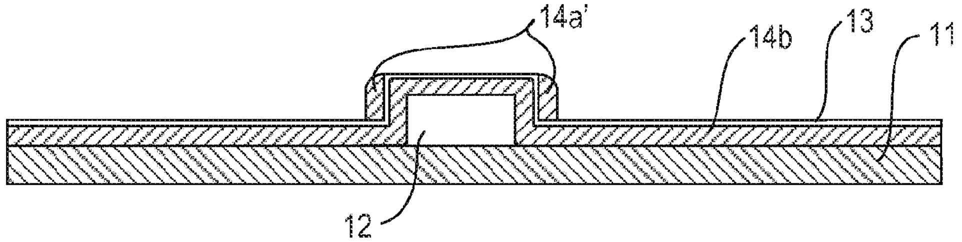

Referring to FIG. 4D, depositing the plurality of passivation layers proximate to the substrate 11 may also include depositing a spacer passivation layer 14*a*, for example, on the etch stop layer 13 such that the spacer passivation layer 14*a* is to be formed into a plurality of spacers 14*a*' as illustrated in FIG. 4E. In an example, top portion of the spacers 14*a*' has a rounded top portion. In an example, the spacer passivation layer 14*a* may have a thickness of 1675 angstroms prior to it being form into the spacers 14*a*'. Performing etching on one passivation layer, that is the spacer passivation layer 14*a*, to form a plurality of spacers 14*a*' substantially across from the sidewalls 12*a* may include anisotropically dry etching the spacer passivation layer 14*a* to form the plurality of spacers 14*a*', for example, having rounded top portions substantially across from the sidewalls 12*a*.

Figure 4F:
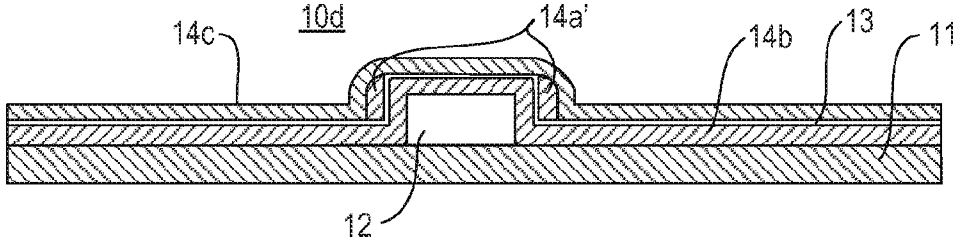

Referring to FIG. 4F, depositing the plurality of passivation layers proximate to the substrate 11 may also include and depositing a chemical isolator passivation layer 14*c* on the spacer passivation layer 14*a* which is in the form of the plurality of spacers 14*a*'. Thus, for example, the film stack 10*d* illustrated in FIG. 1D is formed. In the present example, the spacer passivation layer 14*a* and the electrical isolator passivation layer 14*b* may include a same material, for example, SiN. In an example, the chemical isolator passivation layer 14*c* may include SiC and have a thickness, for example, 725 angstroms, to bring the passivation layers up to a thickness to maintain performance of the at least one electrically-conductive element 12.

The present general inventive concept has been described using non-limiting detailed descriptions of embodiments thereof that are provided by way of example and are not intended to limit the scope of the general inventive concept. It should be understood that features and/or operations described with respect to one embodiment may be used with other embodiments and that not all embodiments of the general inventive concept have all of the features and/or operations illustrated in a particular figure or described with respect to one of the embodiments. Variations of embodiments described will occur to persons of the art. Furthermore, the terms “comprise,” “include,” “have” and their conjugates, shall mean, when used in the disclosure and/or claims, “including but not necessarily limited to.”

It is noted that some of the above described embodiments may describe examples contemplated by the inventors and therefore may include structure, acts or details of structures and acts that may not be essential to the general inventive concept and which are described as examples. Structure and acts described herein are replaceable by equivalents, which perform the same function, even if the structure or acts are different, as known in the art. Therefore, the scope of the general inventive concept is limited only by the elements and limitations as used in the claims.

What is claimed is:

1. A method of manufacturing a plurality of spacers in a film stack, comprising:

forming at least one electrically-conductive element having sidewalls on a substrate;

depositing an etch stop layer at one side of the substrate;

depositing a plurality of passivation layers at the one side of the substrate, the plurality of passivation layers including a spacer passivation layer and an electrical isolator passivation layer; and performing etching of the spacer passivation layer to form a plurality of spacers substantially across from the sidewalls of the at least one electrically-conductive element, the etch stop layer interposed between the at least one electrically-conductive element and the plurality of spacers, and in contact with the plurality of spacers and the electrical isolator passivation layer, the etch stop layer and the electrical isolator passivation layer coextensively extended along the one side of the substrate.

2. The method according to claim 1, wherein the at least one electrically-conductive element comprises:

at least one of a resistor and an electrically-conductive interconnect line.

3. The method according to claim 1, wherein the etch stop layer is in contact with the electrical isolator passivation layer along a length of the one side of the substrate.

4. The method according to claim 1, wherein depositing an etch stop layer at one side of the substrate comprises:

depositing the etch stop layer in contact with the substrate and the at least one electrically-conductive element.

5. The method according to claim 4, wherein depositing a plurality of passivation layers at the one side of the substrate comprises:

depositing the spacer passivation layer on the etch stop layer; and after performing etching of the spacer passivation layer to form the plurality of spacers, depositing the electrical isolator passivation layer on the etch stop layer and the plurality of spacers.

6. The method according to claim 5, wherein depositing a plurality of passivation layers at the one side of the substrate further comprises:

depositing a chemical isolator passivation layer on the electrical isolator passivation layer.

7. The method according to claim 1, wherein depositing an etch stop layer at one side of the substrate comprises:

depositing the etch stop layer on the electrical isolator passivation layer.

8. The method according to claim 7, wherein depositing a plurality of passivation layers at the one side of the substrate comprises:

depositing the electrical isolator passivation layer in contact with the substrate and the at least one electrically-conductive element.

9. The method according to claim 8, wherein depositing a plurality of passivation layers at the one side of the substrate further comprises:

after performing etching of the spacer passivation layer to form the plurality of spacers, depositing a chemical isolator passivation layer on the etch stop layer and the plurality of spacers.

10. The method according to claim 1, wherein performing etching of the spacer passivation layer to form a plurality of spacers comprises:

anisotropically dry etching the spacer passivation layer to form the plurality of spacers having rounded top portions substantially across from the sidewalls.

11. The method according to claim 1, the at least one electrically-conductive element having the sidewalls and an end wall, the etch stop layer and the electrical isolator passivation layer coextensively extended along the sidewalls and the end wall of the at least one electrically-conductive element.

12. A method of manufacturing a plurality of spacers in a film stack, comprising:

forming at least one electrically-conductive element having opposite sidewalls on a substrate;

forming an etch stop layer at one side of the substrate;

forming a plurality of spacers at the opposite sidewalls of the at least one electrically-conductive element; and forming an electrical isolator passivation layer at the one side of the substrate, the etch stop layer interposed between the at least one electrically-conductive element and the plurality of spacers, and in contact with the plurality of spacers and the electrical isolator passivation layer, the etch stop layer and the electrical isolator passivation layer commensurately extended at the one side of the substrate.

13. The method according to claim 12, wherein forming an etch stop layer at one side of the substrate comprises depositing the etch stop layer in contact with the substrate and the at least one electrically-conductive element, and wherein forming an electrical isolator passivation layer at the one side of the substrate comprises depositing the electrical isolator passivation layer on the etch stop layer and the plurality of spacers.

14. The method according to claim 12, wherein forming an etch stop layer at one side of the substrate comprises depositing the etch stop layer on the electrical isolator passivation layer, and wherein forming an electrical isolator passivation layer at the one side of the substrate comprises depositing the electrical isolator passivation layer in contact with the substrate and the at least one electrically-conductive element.

15. The method according to claim 12, the at least one electrically-conductive element having the opposite sidewalls and an end wall, the etch stop layer and the electrical isolator passivation layer commensurately extended at the opposite sidewalls and the end wall of the at least one electrically-conductive element.

* * * * *